United States Patent
Lee et al.

(10) Patent No.: US 9,026,881 B2
(45) Date of Patent: *May 5, 2015

(54) SOFT INPUT, SOFT OUTPUT MAPPERS AND DEMAPPERS FOR BLOCK CODES

(71) Applicant: SK hynix memory solutions inc., San Jose, CA (US)

(72) Inventors: Frederick K. H. Lee, Mountain View, CA (US); Jason Bellorado, Santa Clara, CA (US); Zheng Wu, San Jose, CA (US); Marcus Marrow, Santa Clara, CA (US)

(73) Assignee: SK hynix memory solutions inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/146,929

(22) Filed: Jan. 3, 2014

(65) Prior Publication Data

US 2014/0189458 A1 Jul. 3, 2014

Related U.S. Application Data

(63) Continuation of application No. 13/284,597, filed on Oct. 28, 2011, now Pat. No. 8,650,459.

(60) Provisional application No. 61/443,633, filed on Feb. 16, 2011.

(51) Int. Cl.
*H03M 13/11* (2006.01)
*H03M 13/00* (2006.01)
(Continued)

(52) U.S. Cl.
CPC ........ *H03M 13/1111* (2013.01); *H03M 13/612* (2013.01); *H03M 13/6325* (2013.01);
(Continued)

(58) Field of Classification Search
CPC ............... H04L 1/0054; H04L 1/0057; H03M 13/1111; H03M 13/6343; H03M 13/612; H03M 13/3922; G11B 2220/2508; G11B 2020/185
USPC .......................... 714/752, 758, 759, 780, 794
See application file for complete search history.

(56) References Cited

U.S. PATENT DOCUMENTS 7,594,160 B2 * 9/2009 Cho et al. ........................ 714/780
8,429,509 B2 * 4/2013 Jang et al. ...................... 714/780
(Continued)

OTHER PUBLICATIONS

Djuric et al., "Application of MTR soft-decision decoding in multiple-head magnetic recording systems", Sadhana, vol. 34, Part 3, Jun. 2009, pp. 381-392, India.*
(Continued)

*Primary Examiner* — Cynthia Britt
(74) *Attorney, Agent, or Firm* — Van Pelt, Yi & James LLP

(57) ABSTRACT

A codebook which includes a plurality of messages and a plurality of codewords, a specified codeword bit value, and a specified message bit value are obtained. The LLR for bit ci in a codeword is generated, including by: identifying, from the codebook, those codewords where bit ci has the specified codeword bit value; for a message which corresponds to one of the codewords where bit ci has the specified codeword bit value, identifying those bits which have the specified message bit value; and summing one or more LLR values which correspond to those bits, in the message which corresponds to one of the codewords where bit ci has the specified codeword bit value, which have the specified message bit value.

13 Claims, 9 Drawing Sheets

(51) Int. Cl.
*H04L 1/00* (2006.01)
*G11B 20/18* (2006.01)

(52) U.S. Cl.
CPC ......... *H03M13/6343* (2013.01); *H04L 1/0054* (2013.01); *H04L 1/0057* (2013.01); *G11B 2020/185* (2013.01); *G11B 2220/2508* (2013.01)

(56) References Cited

U.S. PATENT DOCUMENTS

| | | | | |
|---|---|---|---|---|
| 8,650,459 | B1* | 2/2014 | Lee et al. | 714/759 |
| 2008/0276156 | A1* | 11/2008 | Gunnam et al. | 714/801 |
| 2008/0301521 | A1* | 12/2008 | Gunnam et al. | 714/757 |
| 2010/0098192 | A1* | 4/2010 | Ling et al. | 375/332 |
| 2011/0051831 | A1* | 3/2011 | Subrahmanya et al. | 375/262 |
| 2011/0231731 | A1* | 9/2011 | Gross et al. | 714/760 |
| 2011/0264979 | A1* | 10/2011 | Gunnam et al. | 714/752 |
| 2012/0005551 | A1* | 1/2012 | Gunnam | 714/752 |
| 2012/0210197 | A1* | 8/2012 | Jang et al. | 714/799 |

OTHER PUBLICATIONS

Meng Li; Nour, C.A.; Jego, C.; Douillard, C., "Design and FPGA prototyping of a bit-interleaved coded modulation receiver for the DVB-T2 standard," Signal Processing Systems (SIPS), 2010 IEEE Workshop on, vol., No., pp. 162,167, Oct. 6-8, 2010.*

T. Brack, M. Alles, T. Lehnigk-Emden, F. Kienle, N. Wehn, N. E. L'Insalata, F. Rossi, M. Rovini, and L. Fanucci. 2007. Low complexity LDPC code decoders for next generation standards. In Proceedings of the conference on Design, automation and test in Europe (Date '07). EDA Consortium, San Jose, CA, USA, 331-336.*

* cited by examiner

SOFT INPUT, SOFT OUTPUT MAPPERS AND DEMAPPERS FOR BLOCK CODES

CROSS REFERENCE TO OTHER APPLICATIONS

This application is a continuation of co-pending U.S. patent application Ser. No. 13/284,597, entitled SOFT INPUT, SOFT OUTPUT MAPPERS AND DEMAPPERS FOR BLOCK CODES filed Oct. 28, 2011 which claims priority to U.S. Provisional Patent Application No. 61/443,633 entitled COMPUTING LOG-LIKELIHOOD RATIOS FOR BLOCK CODES filed Feb. 16, 2011 which is incorporated herein by reference for all purposes.

BACKGROUND OF THE INVENTION

In coding, information can be divided into two categories: soft information and hard information. Soft information includes some probability, likelihood or certainty that a decision (e.g., whether a bit is a 1 or a 0) is correct. For example, a decoder or other processor configured to output hard information (e.g., about a bit received over a wireless channel or read back from storage media) outputs either a 1 or a 0 without any indication how certain the decoder is in that particular decision. In contrast, a decoder or other processor configured to output soft information includes some certainty or probability along with the decision (e.g., the decoder thinks the bit is a 1 with 75% certainty). It would be desirable if new techniques could be developed for generating soft information using other soft information as input where the techniques are capable of being performed by hardware such as a field-programmable gate array (FPGA), application-specific integrated circuit (ASIC) or a microprocessor such as an ARM core.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
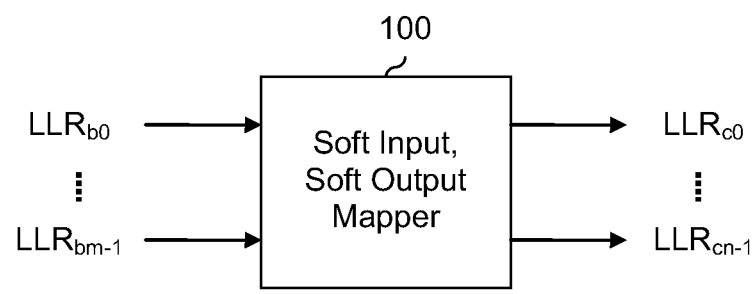
FIG. 1 is a diagram showing an embodiment of a soft input, soft output mapper and a soft input, soft output demapper.
Figure 1:
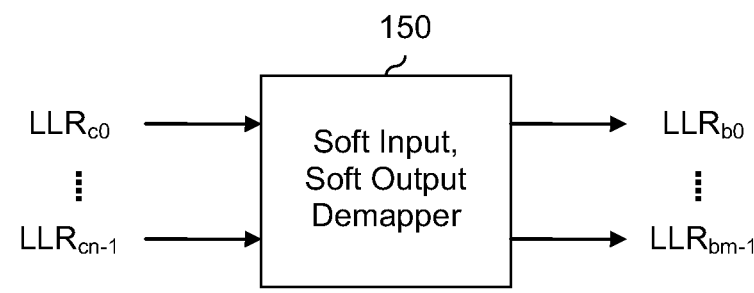

What is described herein is a technique for generating log-likelihood ratios (LLRs) for block codes using other LLRs. FIG. 1 is a diagram showing an embodiment of a soft input, soft output mapper and a soft input, soft output demapper. Mapper 100 generates LLRs for bits c0 thru cn−1 of a codeword using LLRs corresponding to bits b0 thru bm−1 of a message, where the number of LLRs generated is greater than the number of LLRs input. In other words, n>m and mapper 100 is analogous to a modulator or encoder where the number of LLRs (bits) output is greater than the number of LLRs (bits) input. Soft input, soft output demapper 150 performs the inverse function of mapper 100, mapping $LLR_{c0}$ thru $LLR_{cn-1}$ (associated with a codeword) to $LLR_{b0}$ thru $LLR_{bm-1}$ (associated with a message) where the number of LLRs input is greater than the number of LLRs output (e.g., 3 LLRs are input and 2 LLRs are output).

To illustrate the operation of mapper 100 and demapper 150, consider the example codebook shown in the Table 1. In this example, messages have 2 bits and codewords have 3 bits. For example, message 0 (comprising of 00) corresponds to codeword 0 (comprising of 000). Mapper 100 receives 2 LLR values corresponding to message bits b0 and b1 and generates 3 LLR values corresponding to codeword bits c0, c1 and c2 using some or all of the entries in the codebook below. Naturally, changing either the codebook used or the LLR values input will result in different LLR values generated. Similarly, demapper 150 when configured to use the example codebook below will input 3 LLR values (corresponding to bits c0, c1 and c2) and output 2 LLR values (corresponding to bits b0 and b1).

TABLE 1

Codebook with 2-bit messages and 3-bit codewords

| Messages (m = 2) | | | Codewords (n = 3) | | | |
|---|---|---|---|---|---|---|
| | b0 | b1 | | c0 | c1 | c2 |
| Message 0 | 0 | 0 | Codeword 0 | 0 | 0 | 0 |
| Message 1 | 0 | 1 | Codeword 1 | 0 | 0 | 1 |
| Message 2 | 1 | 0 | Codeword 2 | 1 | 0 | 0 |
| Message 3 | 1 | 1 | Codeword 3 | 1 | 1 | 1 |

There are some 3-bit sequences not covered by the codewords in the example codebook above (e.g., the sequence 101 is not included). Such sequences are not codewords and when the term codeword is used, those bit sequences are excluded. In various embodiments, messages and codewords of any length may be used.

In various embodiments, mapper 100 and/or demapper 150 are associated with various block codes, such as a maximum transition run (MTR) code. A maximum transition run code limits the number of consecutive transitions (e.g., 0→1 or 1→0) in a bit stream by inserting additional bits into the bit stream to break up consecutive transitions as needed. Another related block code is a run length limited (RLL) code, which in contrast to a MTR code, forces a transition to occur whenever the number of consecutive 0s or 1s in a bit stream exceeds a limit. Some other block codes which may be employed include cyclic codes and polynomial codes. Some specific examples include Hamming codes, Bose Ray Chaudhuri (BCH) codes and Reed-Solomon codes. In some embodiments, the particular code selected to be employed by mapper 100 and demapper 150 depends upon properties or characteristics of a channel (e.g., distortions or noise introduced by a storage channel or a wireless communications channel, etc.) and/or the error correction capabilities or properties of an error correction code employed by a system (e.g., different error correcting codes can tolerate different types of distortions or noise better than other codes).

Next, various embodiments of techniques to generate LLR values performed by demapper 150 are described. First, a general process for generating $LLR_{bi}$ as a function of $LLR_{ci}$ is described.

Figure 2:
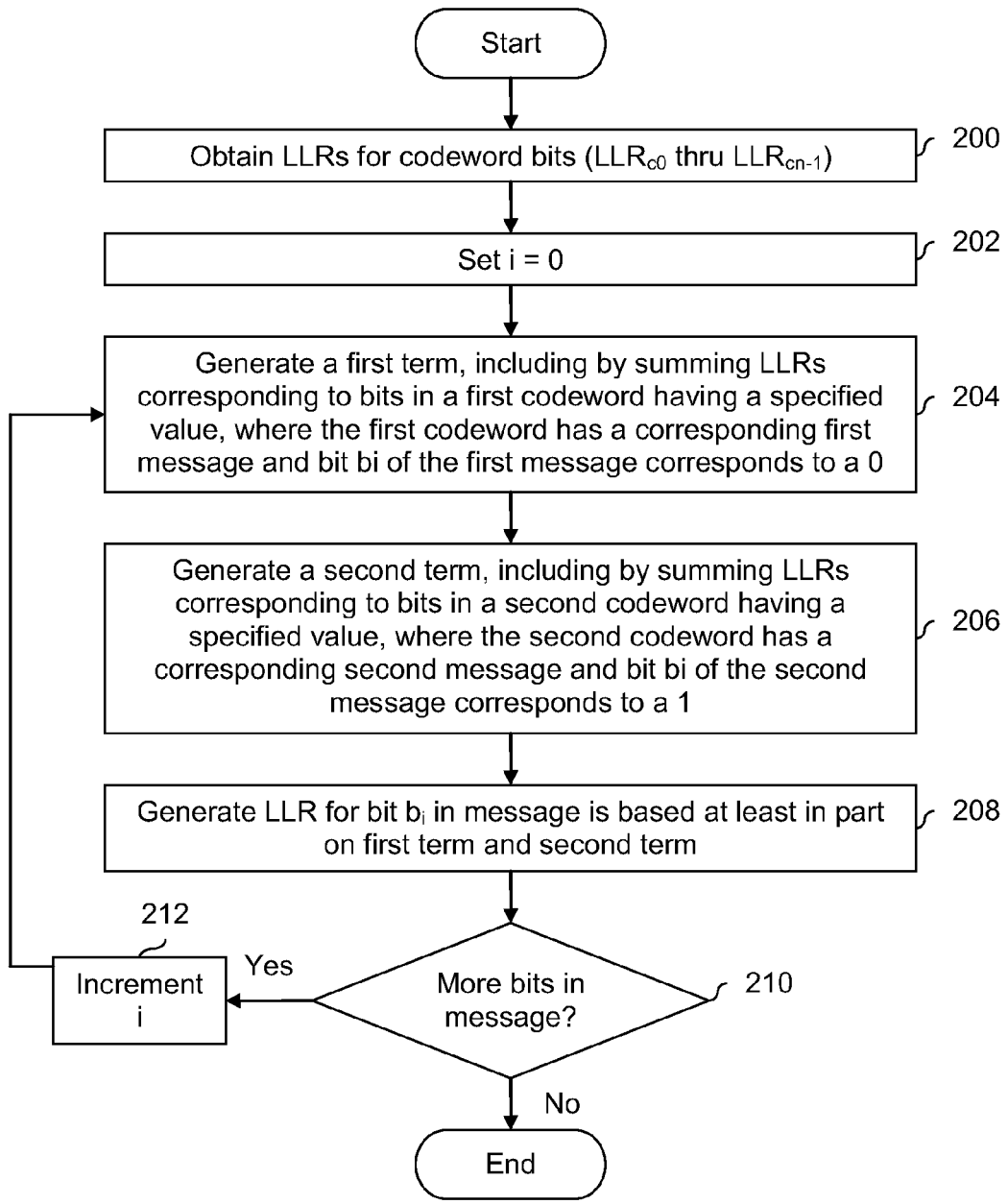
FIG. 2 is a flowchart illustrating an embodiment of a process to generate LLR values for bits of a message ($LLR_{bi}$) using one or more LLR values corresponding to bits in a codeword ($LLR_{ci}$).

FIG. 2 is a flowchart illustrating an embodiment of a process to generate LLR values for bits of a message ($LLR_{bi}$) using one or more LLR values corresponding to bits in a codeword ($LLR_{ci}$). For example, demapper 150 in FIG. 1 performs this process.

At 200, LLRs for codeword bits are obtained (i.e., $LLR_{c0}$ thru $LLR_{cn-1}$). For the example codebook shown in Table 1, $LLR_{c0}$, $LLR_{c1}$ and $LLR_{c2}$ are obtained (e.g., the set (15, 15, −15)). An index i is set to 0 at 202. The index is used to track which bit in a message an LLR is being generated for, so at least in this example $LLR_{b0}$ is generated first.

At 204, a first term is generated, including by summing LLRs corresponding to bits in a first codeword having a specified value (e.g., 0), where the first codeword has a corresponding first message and bit bi of the first message corresponds to a 0. Consider the case when an LLR is generated for bit b0 using the codebook in Table 1. The codewords which are eligible at step 204 are codewords 0 and 1 (because those codewords correspond to messages which have bit b0=0). As an example of step 204, suppose codeword 1 is used and the specified value is 0. LLR values for those bits in codeword 1 which are 0 (i.e., c0 and c1) are summed so that in this example $LLR_{c0}$ and $LLR_{c1}$ are summed. Another way to think of step 204 is that the codeword in step 204 acts as a bitmap or control switch for terms in a summation. Only LLR terms corresponding to bits in the codeword that are the specified value (e.g., 0) are summed.

At 206, a second term is generated, including by summing LLRs corresponding to bits in a second codeword having a specified value (e.g., 0), where the second codeword has a corresponding second message and bit bi of the second message corresponds to a 1. Going back to Table 1, the eligible codewords at 206 are now codewords 2 and 3 because the corresponding messages have bit b0=1. If codeword 3 is used at 206 and the specified value is again 0, then the second term is 0 because no LLRs are selected for the summation (because all of the bits in codeword 3 are 1's). In some embodiments, the specified value at 204 and 206 are the same value.

An LLR for bit bi in a message is generated based at least in part on the first term and the second term at 208. In some embodiments, generating the first term and the second term at 204 and/or 206 include performing a max* function iteratively (e.g., max*(x1, x2) is performed first and the result is incorporated into another max* function). In some embodiments, steps 204 and/or 206 include a maximum function. In some embodiments, generating $LLR_{bi}$ at step 208 includes subtracting the second term from the first term. Some embodiments described in further detail below are exact calculations whereas other embodiments include some simplifications at the expense of relatively small inaccuracies.

It is determined at 210 if there are more bits in a message. For example, once the value of $LLR_{b0}$ is determined, the process may proceed with determining a value for $LLR_{b1}$. If so, the index i is incremented at 212 and a new first term is generated at 204.

Figure 3:
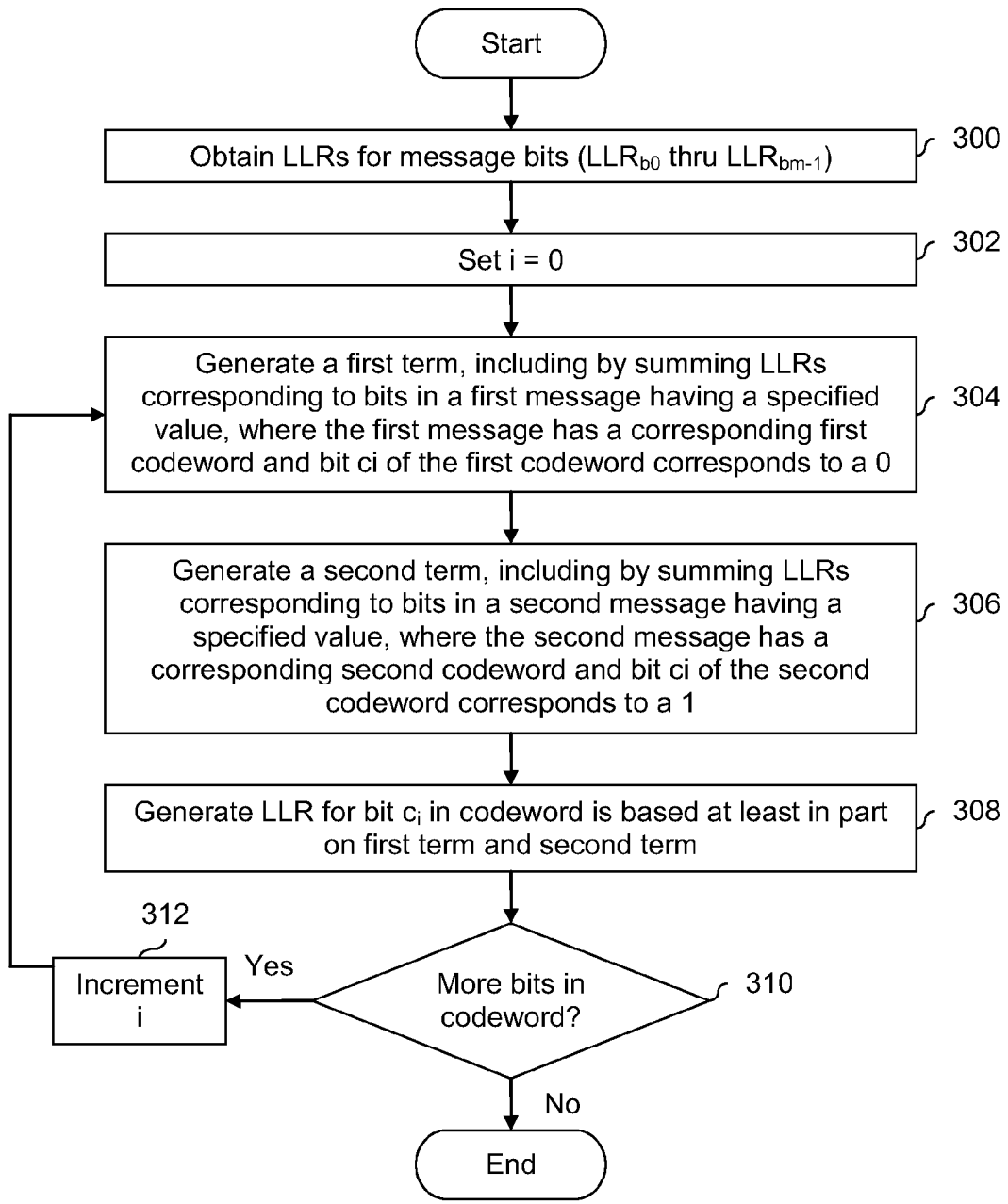
FIG. 3 is a flowchart illustrating an embodiment of a process to generate LLR values for bits in a codeword ($LLR_{ci}$) using LLR values associated with bits of a message ($LLR_{bi}$).

FIG. 3 is a flowchart illustrating an embodiment of a process to generate LLR values for bits in a codeword ($LLR_{ci}$) using LLR values associated with bits of a message ($LLR_{bi}$). In some embodiments, mapper 100 in FIG. 1 performs this process.

LLRs for message bits ($LLR_{b0}$ thru $LLR_{bm-1}$) are obtained at 300. For the code shown in Table 1, two values, $LLR_{b0}$ and $LLR_{b1}$, are obtained. At 302, an index i is set to 0. Similar to FIG. 2, the index i is used to track which codeword bit an LLR is being generated for. At 304, a first term is generated, including by summing LLRs corresponding to bits in a first message having a specified value (e.g., 0), where the first message has a corresponding first codeword and bit ci of the first codeword corresponds to a 0. Using Table 1 as an example, an LLR for bit c0 is to be generated. Messages 0 and 1 are the only messages for which c0 in the corresponding codeword is 0, so one of those messages may be used at step 304. Suppose message 0 is used and the specified value is 0. Since both b0 and b1 in message 0 are equal to the specified value (in this example, 0), the LLRs for those bits are summed (i.e., $LLR_{b0}+LLR_{b1}$).

At 306, a second term is generated, including by summing LLRs corresponding to bits in a second message having a specified value (e.g., 0), where the second message has a corresponding second codeword and bit ci of the second codeword corresponds to a 1. In the example of Table 1, the eligible messages at 306 are messages 2 and 3; if message 2 is used and the specified value is 0, summing the LLRs which meet the criteria produces $LLR_{b1}$ (because b0≠specified value and b1=specified value in message 2).

An LLR is generated for bit ci in the codeword based at least in part on the first term and the second term at 308. In some embodiments, the LLR for bit ci is set to the first term minus the second term. Some examples of step 308 are described in further detail below. It is determined at 310 if there are more bits in a codeword (e.g., which require but have not yet had an LLR generated for them). If so, the index i is incremented at 312 and a new first term is generated at 304.

Next, a precise expression for $LLR_{b_i}$ as a function of $LLR_{c_i}$ (i.e., the processing performed by demapper 150 in FIG. 1) is obtained without making any assumptions or simplifications.

Let C be a block code that accepts m message bits $b_0, b_1, \ldots, b_{m-1}$, and outputs n coded bits, $c_0, c_1, \ldots, c_{n-1}$. The codebook of C thus contains $2^m$ codewords, and the code rate of C is m/n. Define the LLR of $b_i$, i=0, 1, ..., m−1, as $$LLR_{b_i} = K\ln\left(\frac{Pr(b_i = 0)}{Pr(b_i = 1)}\right), \quad (1)$$

where K is a constant for scaling the LLR to an appropriate range for hardware implementation. Similarly, define the LLR of $c_i$, i=0, 1, ..., n−1, as $$LLR_{c_i} = K\ln\left(\frac{Pr(c_i = 0)}{Pr(c_i = 1)}\right). \quad (2)$$

An LLR (for either a bit in a codeword or a bit in a message) is a soft value where the sign indicates a corresponding hard decision and the magnitude indicates a certainty, probability or likelihood in that particular decision. In the examples described herein (which are based upon LLR Equations 1 and 2), a positive LLR value corresponds to a hard decision of 0 (with varying certainty), and a negative LLR value corresponds to a hard decision of 1 (with varying certainty). In some other embodiments, the LLR is defined differently (e.g., a positive LLR value corresponds to a 1 decision and a negative LLR value corresponds to a 0 decision) and the techniques described herein are not limited to LLR Equations 1 and 2.

Equation (2) is rearranged to isolate $Pr(c_i=0)$ and $Pr(c_i=1)$ (i.e., the probabilities, ranging from 0 to 1, that a codeword bit ci is a 0 or a 1, respectively)

$$Pr(c_i = 0) = \frac{e^{-\frac{LLR_{c_i}}{K}}}{1 + e^{-\frac{LLR_{c_i}}{K}}} \quad (3)$$

and $$Pr(c_i = 1) = \frac{1}{1 + e^{-\frac{LLR_{c_i}}{K}}}. \quad (4)$$

Then, using the codebook of interest (which describes the permitted codewords) and Equations (3) and (4)(4) and assuming that the LLRs of the coded bits are statistically independent, the probability of receiving a particular codeword j, j=0, 1, ..., $2^m$−1, can be written as $$Pr(cw_j) = \left(\prod_{c_{j,i}=0} Pr(c_i = 0)\right)\left(\prod_{c_{j,i}=1} Pr(c_i = 1)\right) \quad (5)$$

$$= \left(\prod_{c_{j,i}=0} \frac{e^{-\frac{LLR_{c_i}}{K}}}{1 + e^{-\frac{LLR_{c_i}}{K}}}\right)\left(\prod_{c_{j,i}=1} \frac{1}{1 + e^{-\frac{LLR_{c_i}}{K}}}\right)$$

$$= \left(\prod_{c_{j,i}=0} e^{-\frac{LLR_{c_i}}{K}}\right)\left(\prod_{i=0}^{n-1} \frac{1}{1 + e^{-\frac{LLR_{c_i}}{K}}}\right)$$

$$= \left(e^{\frac{1}{K}\sum_{c_{j,i}=0} LLR_{c_i}}\right)\left(\prod_{i=0}^{n-1} \frac{1}{1 + e^{-\frac{LLR_{c_i}}{K}}}\right),$$

where $c_{j,i}$ denotes bit i of codeword j. For example, the probability that codeword 0 in Table 1 is received is the probability that bit c0 is 0, multiplied by the probability that bit c1 is 0, multiplied by the probability that bit c2 is 0.

Next, it can be noted that the probability that a bit bi in the message will be a 0 is the sum of the probabilities that codewords which result in bit bi in a message being 0 occur. This can be expressed as:

$$Pr(b_i = 0) = \sum_{cw_j : b_i = 0} Pr(cw_j), \quad (6)$$

where the summation is over the probabilities of all codewords, which, when hard-decision decoded, would result in $b_i=0$. Similarly, $$Pr(b_i = 1) = \sum_{cw_j : b_i = 1} Pr(cw_j), \quad (7)$$

where the summation is over the probabilities of all codewords, which, when hard-decision decoded, would result in $b_i=1$.

Returning back to the example of Table 1, consider the example of the second bit in the message, b1. The probability that b1 is 0 is the same thing as the probability that either codeword 0 or codeword 2 occurs, because those are the codewords that would result in b1 being mapped to 0. Similarly, the probability that b1 is a 1 is the same as the probability that either codeword 1 or codeword 3 occurs.

Substituting Equations (6) and (7) into Equation (1) with the help of Equation (5) leads to the expression $$LLR_{b_i} = K\ln\left(\frac{\sum_{cw_j : b_i = 0} Pr(cw_j)}{\sum_{cw_j : b_i = 1} Pr(cw_j)}\right) \quad (8)$$

$$= K\ln\left(\frac{\left(\sum_{cw_j : b_i = 0} e^{\frac{1}{K}\sum_{c_{j,i}=0} LLR_{c_i}}\right)\left(\prod_{i=0}^{n-1} \frac{1}{1 + e^{-\frac{LLR_{c_i}}{K}}}\right)}{\left(\sum_{cw_j : b_i = 1} e^{\frac{1}{K}\sum_{c_{j,i}=0} LLR_{c_i}}\right)\left(\prod_{i=0}^{n-1} \frac{1}{1 + e^{-\frac{LLR_{c_i}}{K}}}\right)}\right)$$

$$= K\ln\left(\frac{\sum_{cw_j : b_i = 0} e^{\frac{1}{K}\sum_{c_{j,i}=0} LLR_{c_i}}}{\sum_{cw_j : b_i = 1} e^{\frac{1}{K}\sum_{c_{j,i}=0} LLR_{c_i}}}\right)$$

-continued $$= K\ln\left(\sum_{cw_j:b_i=0} e^{\frac{1}{K}\sum_{c_{j,i}=0}LLR_{c_i}}\right) - K\ln\left(\sum_{cw_j:b_i=1} e^{\frac{1}{K}\sum_{c_{j,i}=0}LLR_{c_i}}\right).$$

To evaluate Equation (8), the max* function is applied to the first term and the second term where $$\ln\left(\sum_{i=0}^{d-1} e^{x_i}\right) = \max^*(x_{d-1}, \max^*(x_{d-2}, \ldots \max^*(x_3, \max^*(x_2, x_1)))), \quad (9)$$

and $$\max^*(x, y) \stackrel{def}{=} \ln(e^x + e^y) = \max(x, y) + \ln(1 + e^{-|x-y|}). \quad (10)$$

In some embodiments, the natural log function in Equation (10) is implemented using a lookup table. In some applications this is desirable since it is faster and/or less computationally expensive than computing a logarithm on-the-fly. Since the LLR values have known minimum and maximum values (e.g., ranging from −15 to +15) the full range of input values to the natural log function can be calculated ahead of time and the lookup table can be populated accordingly.

The following figure expresses Equation (8) (when computed with the aid of Equation (9)) as a flowchart.

Figure 4:
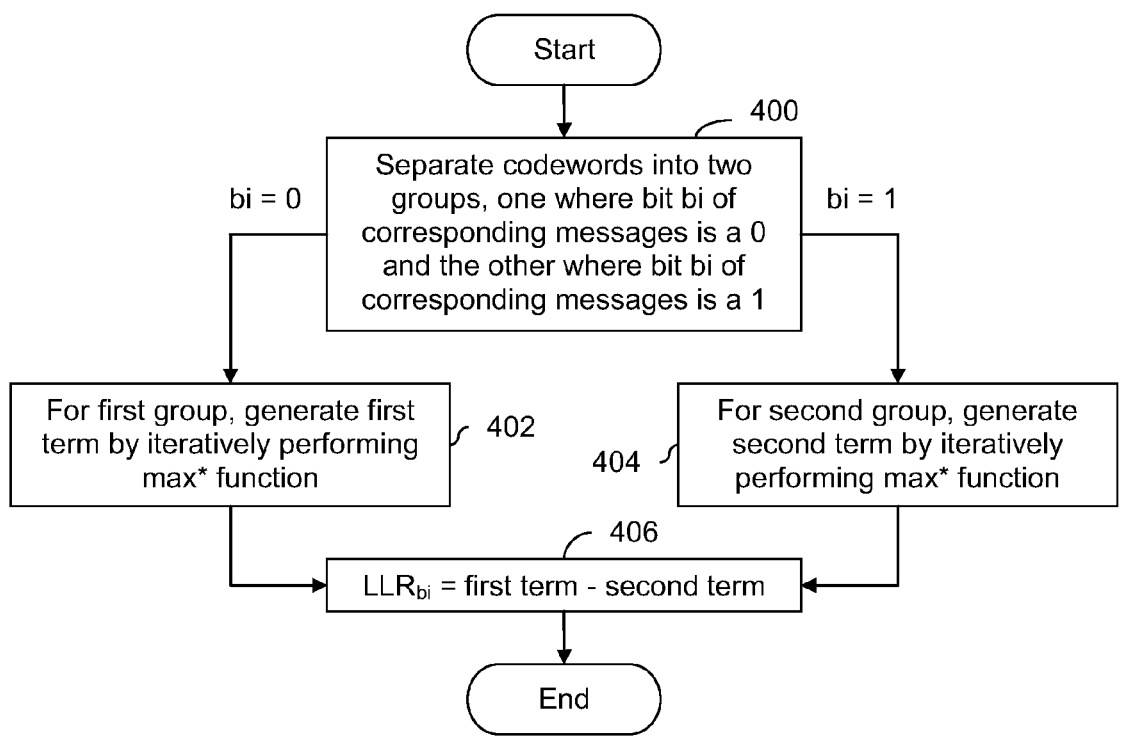
FIG. 4 is a flowchart illustrating an embodiment of a process to generate $LLR_{bi}$ as a function of $LLR_{ci}$ by iteratively performing a max* function.

FIG. 4 is a flowchart illustrating an embodiment of a process to generate $LLR_{bi}$ as a function of LLR, by iteratively performing a max* function. In some embodiments, steps 204-208 of FIG. 2 are performed as shown; in some other embodiments some other technique is used to perform those steps.

At 400, codewords are separated into two groups, one where bit bi of corresponding messages is a 0 and the other where bit bi of corresponding messages is a 1. Suppose an LLR for bit b1 is being generated using the codebook in Table 1. Codewords 0 and 2 would form one group (b1 in messages=0) and codewords 1 and 3 would form the other group (b1 in messages=1).

At 402 and 404, respectively, a first term is generated for the first group by iteratively performing a max* function and a second term is generated for the second group by iteratively performing a max* function. For example, the term K ln $$\left(\sum_{cw_j:b_i=0} e^{\frac{1}{K}\sum_{c_{j,i}=0}LLR_{c_i}}\right)$$

from Equation (8) is generated at 402 and the term K ln $$\left(\sum_{cw_j:b_i=1} e^{\frac{1}{K}\sum_{c_{j,i}=0}LLR_{c_i}}\right)$$

from Equation (8) is generated at 404. Various embodiments for performing steps 402 and 404 are described in further detail below. At 406, $LLR_{bi}$ is set to the first term (e.g., generated at 402) minus the second term (e.g., generated at 404).

As an example, consider Tables 2 and 3 corresponding to the codebook shown in Table 1 where the value of $LLR_{b1}$ is determined. Table 2 shows an example of a first group (e.g., associated with step 402 in FIG. 4) and Table 3 shows an example of a second group (e.g., associated with step 404 in FIG. 4). For clarity, bit b0 in messages 0-4 is not shown.

TABLE 2

Example of a first group to generate $LLR_{b1}$

| Messages in first group (b1 = 0) | | Codewords in first group (b1 = 0) | | | |
|---|---|---|---|---|---|
| | b1 | | c0 | c1 | c2 |
| Message 0 | 0 | Codeword 0 | 0 | 0 | 0 |
| Message 2 | 0 | Codeword 2 | 1 | 0 | 0 |

TABLE 3

Example of a second group to generate $LLR_{b1}$

| Messages in second group (b1 = 1) | | Codewords in second group (b1 = 1) | | | |
|---|---|---|---|---|---|
| | b1 | | c0 | c1 | c2 |
| Message 1 | 1 | Codeword 1 | 0 | 0 | 1 |
| Message 3 | 1 | Codeword 3 | 1 | 1 | 1 |

The following figure describes an embodiment of steps 402 and/or 404 in FIG. 4.

Figure 5:
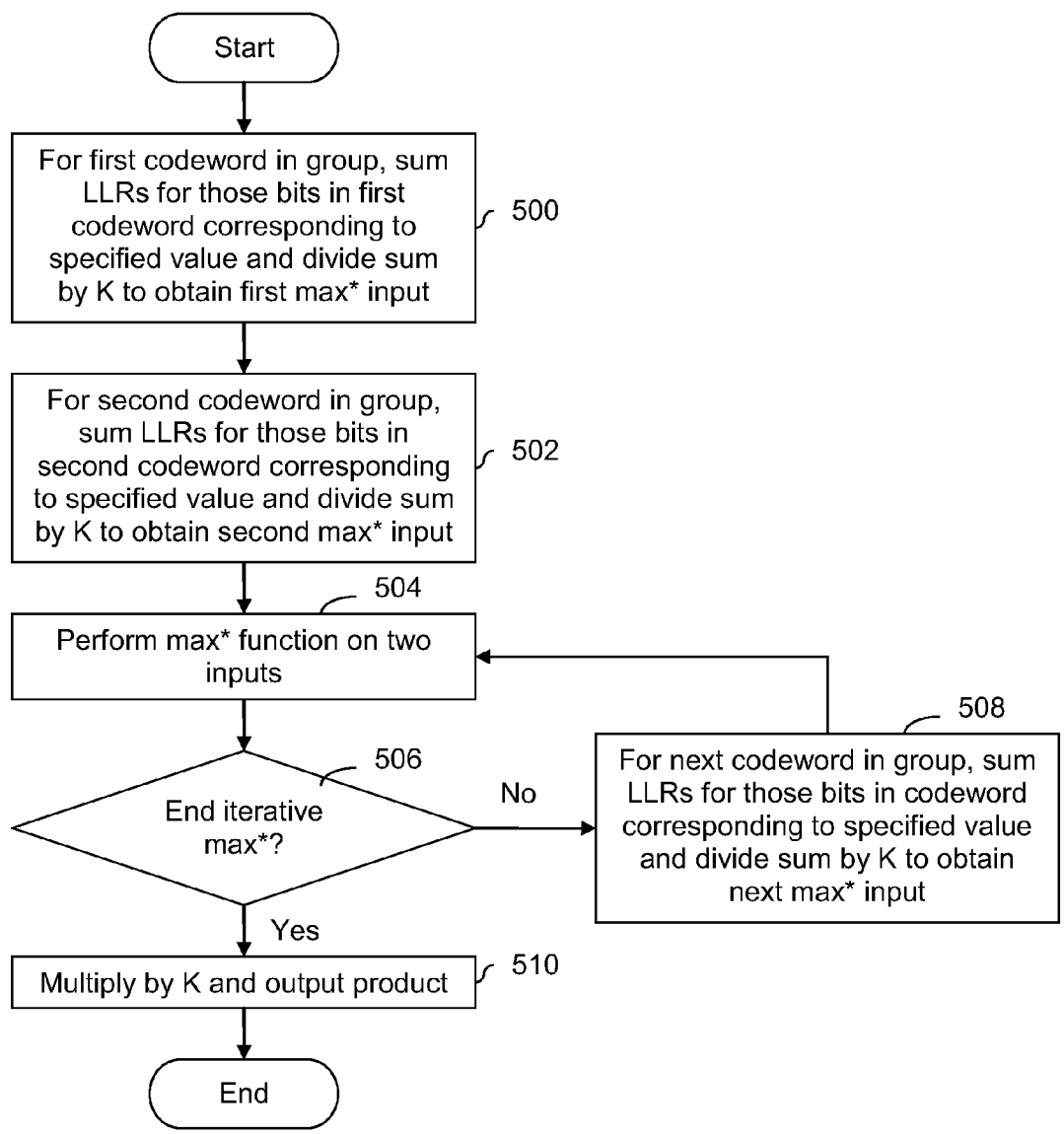
FIG. 5 is a flowchart illustrating an embodiment of a process to generate a term used to calculate an LLR value by iteratively performing a max* function.

FIG. 5 is a flowchart illustrating an embodiment of a process to generate a term used to calculate an LLR value by iteratively performing a max* function. In some embodiments, steps 402 and/or 404 in FIG. 4 are performed as shown.

For a first codeword in a group, LLRs for those bits in a first codeword corresponding to a specified value (e.g., 0) are summed and the sum is divided by K to obtain a first max* input at 500. See, for example Table 4 where the specified value is 0, K=1, $LLR_{c0}$=15, $LLR_{c1}$=15 and $LLR_{c2}$=−15. For each bit in codeword 0 that is a 0, the corresponding LLRs are summed. Since all three bits are zero for codeword 0 the sum is $LLR_{c0}+LLR_{c1}+LLR_{c2}$=15+15+−15=15. K=1 so the sum divided by K is also 15.

TABLE 4

Example of a max* function applied to a first group, where K = 1, $LLR_{c0}$ = 15, $LLR_{c1}$ = 15, $LLR_{c2}$ = −15, and the max* result is used to generate $LLR_{b1}$

| Messages in first group (b1 = 0) | | Codewords in first group (b1 = 0) | | | | | |
|---|---|---|---|---|---|---|---|
| | b1 | | c0 | c1 | c2 | Sum of LLRs/K | max* | Numeric value |
| Message 0 | 0 | Codeword 0 | 0 | 0 | 0 | 15 + 15 +−15 = 15 | max* (15, 0) | ~15.00000031 |
| Message 2 | 0 | Codeword 2 | 1 | 0 | 0 | 15 +− 15 = 0 | | |

At 502, for a second codeword in a group, LLRs for those bits in the second codeword corresponding to a specified value (e.g., 0) are summed and the sum is divided by K to obtain a second max* input. To continue the example of Table 4, the second codeword is codeword 2. Bits c1 and c2 are equal to zero so the sum is $LLR_{c1}+LLR_{c2}=15+-15=0$. When the sum is divided by K this results in 0.

A max* function is performed on two inputs at 504. For example, the input from step 500 (15 in the example above) and the input from step 502 (0 in the example above) are input so at 504 the function max*(15, 0) is performed. Numerically, max*(15, 0) is approximately 15.00000031.

It is determined at 506 whether to end an iterative max* process. If so, a multiply by K is performed and the product is output at 510. If it is determined at 506 to continue, then for a next codeword in a group, LLRs for those bits in the codeword corresponding to a specified value (e.g., 0) are summed and the sum is divided by K to obtain a next max* input at 508. A max* function is performed on two inputs at 504. For example, the value obtained at 508 and the result from the previous iteration of step 504 are input to a max* function.

To complete the example of how FIG. 5 may be used to perform steps 402 and/or 404 of FIG. 4, Table 5 shows some example values for step 404 when implemented using the process of FIG. 5. Step 404 in this example would result in a numeric value of 30+9.34808×10$^{-14}$, which is rounded to 30. Step 406 in FIG. 4 is to subtract the second term (30 in this example) from the first term (15.00000031 in this example) which results in $LLR_{b1}=-14.99999969$.

TABLE 5

Example of a max* function applied to a second group, where K = 1, $LLR_{c0}$ = 15, $LLR_{c1}$ = 15, $LLR_{c2}$ = −15, and the max* result is used to generate $LLR_{b1}$

| Messages in second group (b1 = 1) | | Codewords in second group (b1 = 1) | | | | | |
|---|---|---|---|---|---|---|---|
| | b1 | | c0 | c1 | c2 | Sum of LLRs/K | max* | Numeric value |
| Message 1 | 1 | Codeword 1 | 0 | 0 | 1 | 15 + 15 = 30 | max* (30, 0) | ~30 |
| Message 3 | 1 | Codeword 3 | 1 | 1 | 1 | 0 | | |

In some embodiments, the decision at 506 is to perform the iterative max* function until there are no more codewords in a group. Put another way, the max* function is performed in an exhaustive manner so that the resulting $LLR_{bi}$ is an exact value and not an approximation.

Alternatively, in some embodiments a simplification is made which results in an approximate LLR. Some mathematical functions are expensive and/or difficult to perform when implemented in hardware (such as a field-programmable gate array (FPGA) or an application-specific integrated circuit (ASIC)) and the additional accuracy may not be worth the additional computational complexity or difficulty.

For example, Table 6 shows sums of LLRs values divided by K in sorted order: 15, 7, 0, −11 and −14. As is shown, most of the contribution comes from the first iteration of the max* function (i.e., max*(15,7)), with the second, third and fourth iterations changing the value relatively little.

TABLE 6

Sorted sums-divided-by-K and numeric values of iterated max* functions

| Iteration | Sum of LLRs/K | max* | Numeric value |
|---|---|---|---|
| | 15 | N/A | N/A |
| 1$^{st}$ | 7 | max*(15, 7) | ~15.00033541 |
| 2$^{nd}$ | 0 | max*(0, max*(15, 7)) | ~15.00033571 |
| 3$^{rd}$ | −11 | max*(−11, max*(0, max*(15, 7))) | ~15.00033571 |
| 4$^{th}$ | −14 | max*(−14, max*(−11, max*(0, max*(15, 7)))) | ~15.00033571 |

In some embodiments, only the p largest summands in Equation (9) are performed and the rest are ignored, where, for the case of Equation (8), p can range from 2 to $2^{m-1}$ and does not have to be equal for both the first and second terms. Equation (10) in such embodiments is applied recursively (p−1) times for each term. In decision 506 in FIG. 5, this corresponds to stopping after (p−1) iterations of the max* function. In some embodiments, the sum of LLR values divided by K are all first calculated and then sorted in descending order where the iterative max* function operates on the largest values first. This may result in later iterations of the max* function changing the produced value relatively little compared to earlier iterations.

In some embodiments, it is decided at 506 to end the process if a next sum of LLRs divided by K is negligible. For example, performing the second iteration of the max* function in Table 6 would only change the result by $3\times10^{-7}$ (i.e., 15.00033571−15.00033541). In some embodiments, a next sum of LLRs divided by K is determined to be negligible if the difference is relatively large between a current max* function output and a next sum of LLRs divided by K (see, e.g., Table 6). Otherwise, it may be desirable to do more and/or all of max* functions. See Table 7 for such an example. In the example of Table 7, it may not be desirable to only perform on iteration of the max* function since one iteration produces a numeric value of ~1.69 whereas performing all four max* iterations produces a numeric value of ~2.61.

TABLE 7

Equal sums-divided-by-K and numeric values of iterated max* functions

| Iteration | Sum of LLRs/K | max* | Numeric value |
|---|---|---|---|
|  | 1 | N/A | N/A |
| $1^{st}$ | 1 | max*(1, 1) | ~1.693147181 |
| $2^{nd}$ | 1 | max*(1, max*(1, 1)) | ~2.098612289 |
| $3^{rd}$ | 1 | max*(1, max*(1, max*(1, 1))) | ~2.386294361 |
| $4^{th}$ | 1 | max*(1, max*(1, max*(1, max*(1, 1)))) | ~2.609437912 |

Another approximation can be performed by observing the contributions to the max* function from the underlying maximum function and natural log function (see Equation (10)). Table 8 shows the same sum of LLRs divided by K shown in Table 6 with the contributions from the maximum function and natural log functions broken down. As can be seen in the example of Table 8, the maximum function dominates the natural log function, at least in this example.

TABLE 8

Contributions to numeric values of iterated max* functions from maximum function and natural log function

| Iteration | Sum of LLRs/K | Max | ln | Numeric value |
|---|---|---|---|---|
|  | 15 | N/A | N/A | N/A |
| $1^{st}$ | 7 | 15 | 0.000335406 | ~15.00033541 |
| $2^{nd}$ | 0 | 15.00033541 | $3.058 \times 10^{-7}$ | ~15.00033571 |
| $3^{rd}$ | −11 | 15.00033571 | $5.10747 \times 10^{-12}$ | ~15.00033571 |
| $4^{th}$ | −14 | 15.00033571 | $2.54241 \times 10^{-13}$ | ~15.00033571 |

Returning to Equation (10), this corresponds to eliminating the second term (i.e., the contribution from the natural log function) in Equation (10) which is equivalent to approximating each term in Equation (8) with the largest summand. Equation (8) then reduces to $$LLR_{b_i} = \max_{cw_j:b_i=0}\left(\sum_{c_{j,i}=0} LLR_{c_i}\right) - \max_{cw_j:b_i=1}\left(\sum_{c_{j,i}=0} LLR_{c_i}\right). \quad (11)$$

In some applications, the embodiment of Equation (11) is desirable because the scaling factor K is cancelled out in Equation (11) and/or the maximum function is computationally a relatively easy operation to perform. Equation (11) in flowchart form is described in the next figure.

Figure 6:
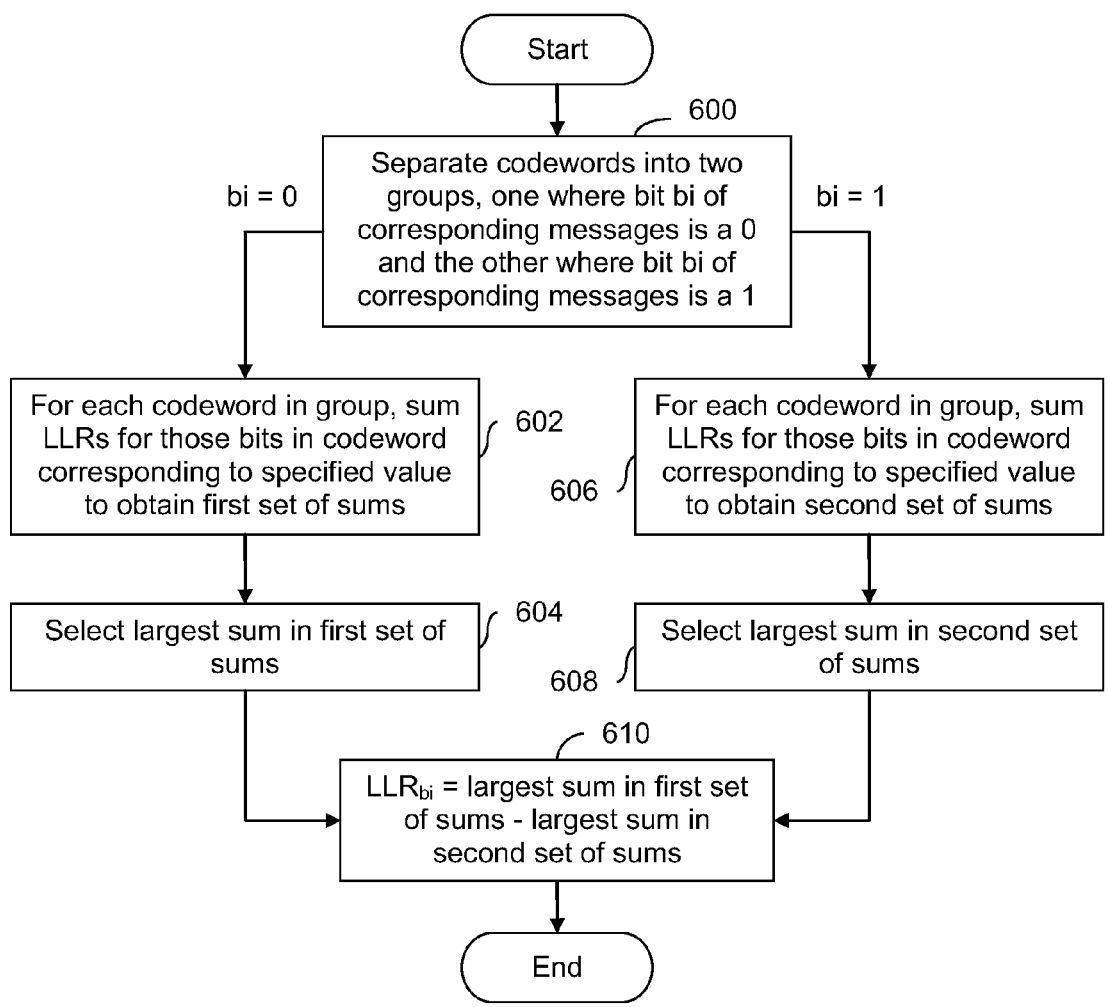
FIG. 6 is a flowchart illustrating an embodiment of a process to approximate LLRs for bits in a message ($LLR_{bi}$) using a maximum function.

FIG. 6 is a flowchart illustrating an embodiment of a process to approximate LLRs for bits in a message ($LLR_{b_i}$) using a maximum function. In some embodiments, steps 204-208 of FIG. 2 are performed as shown. In some embodiments, before the process of FIG. 6 is performed, it is first determined that the approximation is appropriate or otherwise acceptable (e.g., a contribution from a maximum function dominates that from a natural log function).

At 600, codewords are separated into two groups, one where bit bi of corresponding messages is a 0 and the other where bit bi of corresponding messages is a 1. For those where bi=0, for each codeword in the group, LLRs for those bits in a codeword corresponding to a specified value (e.g., 0) are summed to obtain a first set of sums at 602. At 604, the largest sum in the first set of sums is selected. In Equation (11), this corresponds to $\max_{cw_j:b_i=0}(\Sigma_{c_{j,i}=0} LLR_{c_i})$. See Table 9 where an LLR is determined for bit b1, the specified value in step 602 is 0, $LLR_{c0}$=15, $LLR_{c1}$=15 and $LLR_{c2}$=−15. The sum of LLRs for codeword 0 is 15 and the sum of LLRs for codeword 2 is 0 (step 602). Since 15 is greater than 0, 15 is selected at step 604.

TABLE 9

Example of sums of LLRs for a first group of codewords, the largest sum of which is selected and used to generate $LLR_{b1}$

| Messages in first group (b1 = 0) | Codewords in first group (b1 = 0) | | | | | Max of sums |
|---|---|---|---|---|---|---|
|  | b1 |  | c0 | c1 | c2 | Sum of LLRs |  |
| Message 0 | 0 | Codeword 0 | 0 | 0 | 0 | 15 + 15 +− 15 = 15 | 15 |
| Message 2 | 0 | Codeword 2 | 1 | 0 | 0 | 15 +− 15 = 0 |  |

For those where bi=1, for each codeword in the group, LLRs for those bits in a codeword corresponding to a specified value (e.g., 0) are summed to obtain a second set of sums at 606. At 608, the largest sum in the second set of sums is selected. In Equation (11), this is the second term, $\max_{cw_j:b_i=1}(\Sigma_{c_{j,i}=0} LLR_{c_i})$. See Table 10 for an example of steps 706 and 708.

TABLE 10

Example of sums of LLRs for a second group of codewords, the largest sum of which is selected and used to generate $LLR_{b1}$

| Messages in second group (b1 = 1) | Codewords in second group (b1 = 1) | | | | | Max of sums |
|---|---|---|---|---|---|---|
|  | b1 |  | c0 | c1 | c2 | Sum of LLRs |  |
| Message 1 | 1 | Codeword 1 | 0 | 0 | 1 | 15 + 15 = 30 | 30 |
| Message 3 | 1 | Codeword 3 | 1 | 1 | 1 | 0 |  |

At 610, $LLR_{b_i}$ is set to the largest sum in the first set of sums minus the largest sum in the second set of sums. In the example of Tables 9 and 10, $LLR_{b1}$=15−30=−15. As described above, LLR is defined herein so that a positive LLR value corresponds to a 0 and a negative LLR value corresponds to a 1. Since the LLRs of the input codeword are 15, 15 and −15, the most likely codeword is 001 (i.e., codeword 1). Message 1 corresponds to codeword 1 and bit b1 of message 1 is a 1, so $LLR_{b1}$=−15 (where a negative value corresponds to a 1) is consistent with the $LLR_{c_i}$ values that were input.

The same techniques described above can be applied to soft input, soft output mapper 100 in FIG. 1. $LLR_{c_i}$ as a function of $LLR_{b_i}$ can be obtained using the same techniques to obtain Equation (8) and is given by $$LLR_{c_i} = K\ln\left(\sum_{msg_j:c_i=0} e^{\frac{1}{K}\sum_{b_{j,i}=0}LLR_{b_i}}\right) - K\ln\left(\sum_{msg_j:c_i=1} e^{\frac{1}{K}\sum_{b_{j,i}=0}LLR_{b_i}}\right), \quad (12)$$

where the summation in the first term is over all messages which have a corresponding codeword where $c_i=0$, and, similarly, the summation in the second term is over all messages which have a corresponding codeword where $c_i=1$. Unlike Equation (8), the number of summands in the two terms are not necessarily equal, although the total number of summands from both terms add up to $2^m$. Since the derivation of Equation (12) is similar to that of Equation (8) it is not repeated herein.

Similar to how Equations (9) and (10) permit Equation (8) to be calculated, Equations (9) and (10) also permit Equation (12) to be calculated. If the max* function is performed exhaustively then the $LLR_{c_i}$ value is exact; alternatively, the inputs to the max* function can be sorted in descending order and the max* function is performed only on the largest inputs and the $LLR_{c_i}$ value produced is an approximation.

Tables 11 and 12 give an example of using Equations (9), (10) and (12) to determine $LLR_{c_0}$ for the codebook shown in Table 1 when K=1, $LLR_{b_0}$=15 and $LLR_{b_1}$=0.

TABLE 11

Example of a max* function applied to a first group, where K = 1, $LLR_{b_0}$ = 15, and $LLR_{b_1}$ = 0, and the max* result is used to generate $LLR_{c_0}$

| Codewords in first group (c0 = 0) | | | | Messages in first group (c0 = 0) | | |
|---|---|---|---|---|---|---|
| | c0 | b0 | b1 | Sum of LLRs/K | max* | Numeric value |
| Codeword 0 | 0 | Message 0 | 0 | 0 | 15 + 0 = 15 | max* (15, 15) | ~15.69314718 |
| Codeword 1 | 0 | Message 1 | 0 | 1 | 15 | | |

TABLE 12

Example of a max* function applied to a second group, where K = 1, $LLR_{b_0}$ = 15, and $LLR_{b_1}$ = 0, and the max* result is used to generate $LLR_{c_0}$

| Codewords in second group (c0 = 1) | | | | Messages in second group (c0 = 1) | | |
|---|---|---|---|---|---|---|
| | c0 | b0 | b1 | Sum of LLRs/K | max* | Numeric value |
| Codeword 2 | 1 | Message 2 | 1 | 0 | 0 | max* (0, 0) | ~0.693147181 |
| Codeword 3 | 1 | Message 3 | 1 | 1 | 0 | | |

In the example above, $LLR_{c_0}$=15.69314718−0.693147181=15. Since the first bit (b0) of the input message is likely a 0 ($LLR_{b_0}$=15) and the second bit of the input message is indeterminate ($LLR_{b_1}$=0), the input message is likely either message 0 (i.e., 00) or message 1 (i.e., 01) and for both messages, bit c0 of the corresponding codewords is 0, which is consistent with the generated value of $LLR_{c_0}$=15.

Simplifying the max* function to a maximum function resulted in Equation (11) and the same technique can be used to obtain the following.

$$LLR_{c_i} = \max_{msg_j:c_i=0}\left(\sum_{b_{j,i}=0} LLR_{b_i}\right) - \max_{msg_j:c_i=1}\left(\sum_{b_{j,i}=0} LLR_{b_i}\right). \quad (13)$$

Tables 13 and 14 give an example of using Equation (13) to determine $LLR_{c_0}$ for the codebook shown in Table 1 when K=1, $LLR_{b_0}$=15 and $LLR_{b_1}$=0.

TABLE 13

Example of a maximum function applied to a first group, where K = 1, $LLR_{b_0}$ = 15, and $LLR_{b_1}$ = 0, and the maximum is used to generate $LLR_{c_0}$

| Codewords in first group (c0 = 0) | | | Messages in first group (c0 = 0) | | |
|---|---|---|---|---|---|
| | c0 | | b0 | b1 | Sum of LLRs | Max of sums |
| Codeword 0 | 0 | Message 0 | 0 | 0 | 15 + 0 = 15 | 15 |
| Codeword 1 | 0 | Message 1 | 0 | 1 | 15 | |

TABLE 14

Example of a maximum function applied to a second group, where K = 1, $LLR_{b_0}$ = 15, and $LLR_{b_1}$ = 0, and the maximum is used to generate $LLR_{c_0}$

| Codewords in second group (c0 = 1) | | | Messages in second group (c0 = 1) | | |
|---|---|---|---|---|---|
| | c0 | | b0 | b1 | Sum of LLRs | Max of sums |
| Codeword 2 | 1 | Message 2 | 1 | 0 | 0 | 0 |
| Codeword 3 | 1 | Message 3 | 1 | 1 | 0 | |

Using the results from Tables 13 and 14, $LLR_{c_0}$=15−0=15. For the same reasons described above with respect to Tables 11 and 12, the $LLR_{c_0}$ value generated is consistent with the input $LLR_{b_i}$ values.

Returning back to FIG. 1, mapper 100 and demapper 150 may be used in a variety of applications. The following figures show a magnetic disk storage system which uses mapper 100 and demapper 150 (e.g., configured to perform any of the LLR generation techniques described above). In some other embodiments, mapper 100 and demapper 150 are used in some other application, such as a wireless or wire-line communication system.

Figure 7:
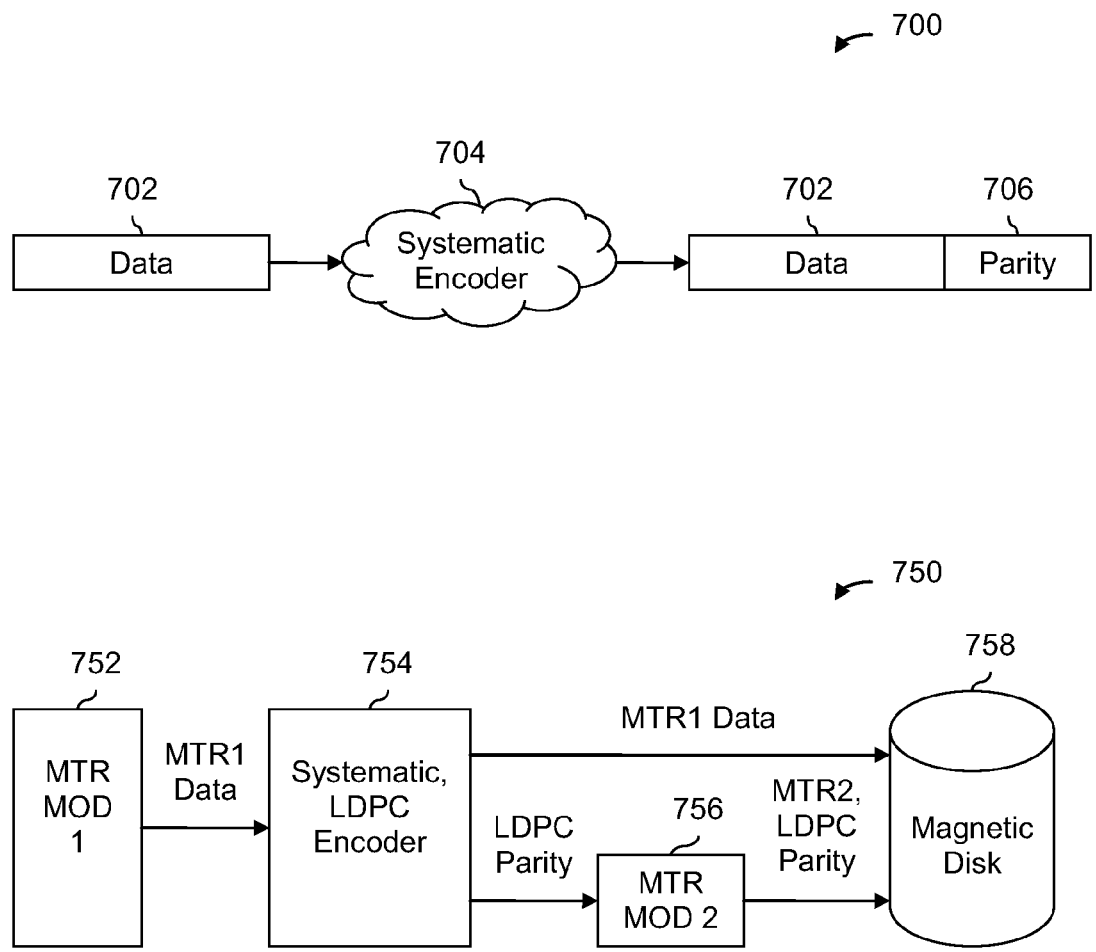
FIG. 7 is a diagram showing an embodiment of a systematic code and a write processor portion of a storage system.

FIG. 7 is a diagram showing an embodiment of a systematic code and a write processor portion of a storage system. In diagram 700, data 702 is input to a systematic encoder (704). A systematic encoder is one in which the input data is included in its original form in the encoded output. In this particular example, the output includes the data (702) followed by the parity information (706), but the data may be in any portion or position of the encoded output.

Diagram 750 shows an example of a write processor configured to process write data prior to storage in a magnetic disk (758). In the example shown, data is first processed by a first MTR modulator 752. As described above, an MTR modulator attempts to prevent too many transitions (e.g., 0→1 or 1→0) from occurring over some period of time by inserting bits into the bit stream (e.g., for every 51 bits input, 54 bits are output).

The MTR modulated data is passed from the first MTR modulator (752) to a systematic, low-density parity-check (LDPC) encoder (754). As described above, a systematic encoder outputs encoded data which includes the original input data. This systematic data (i.e., the MTR1 data output by LDPC encoder 754) is passed from LDPC encoder 754 to magnetic disk 758.

Although the MTR 1 data output by LDPC encoder 754 to magnetic disk 758 has the desired properties prior to entering the channel (i.e., magnetic disk 758), the LDPC parity information generated by LDPC encoder 754 does not necessarily have those properties. To ensure that it does, the LDPC parity information is processed by a second MTR modulator 756 which outputs MTR2 LDPC parity information and stores it in magnetic disk 758. In some embodiments, the first and second MTR modulators (752 and 756) perform the same modulation function. In some embodiments, the same (e.g., physical) modulator is used at 752 and 756 (e.g., a single modulator is instantiated).

In some applications, a modulator is selected based on the properties of an error correction code (e.g., LDPC encoder 754) and/or distortions or noise introduced by a channel (e.g., magnetic disk 758). For example, if a particular error correction code is vulnerable to certain types of errors, a signal may be modulated to prevent or mitigate such errors from being introduced by the channel.

This particular example shows an LDPC encoder and an MTR modulator but the techniques are not necessarily limited to this example. In various embodiments, any code and/or modulation technique may be used, for example if different properties or characteristics are desired (e.g., because other applications may have different performance requirements and/or a different channel).

Figure 8:
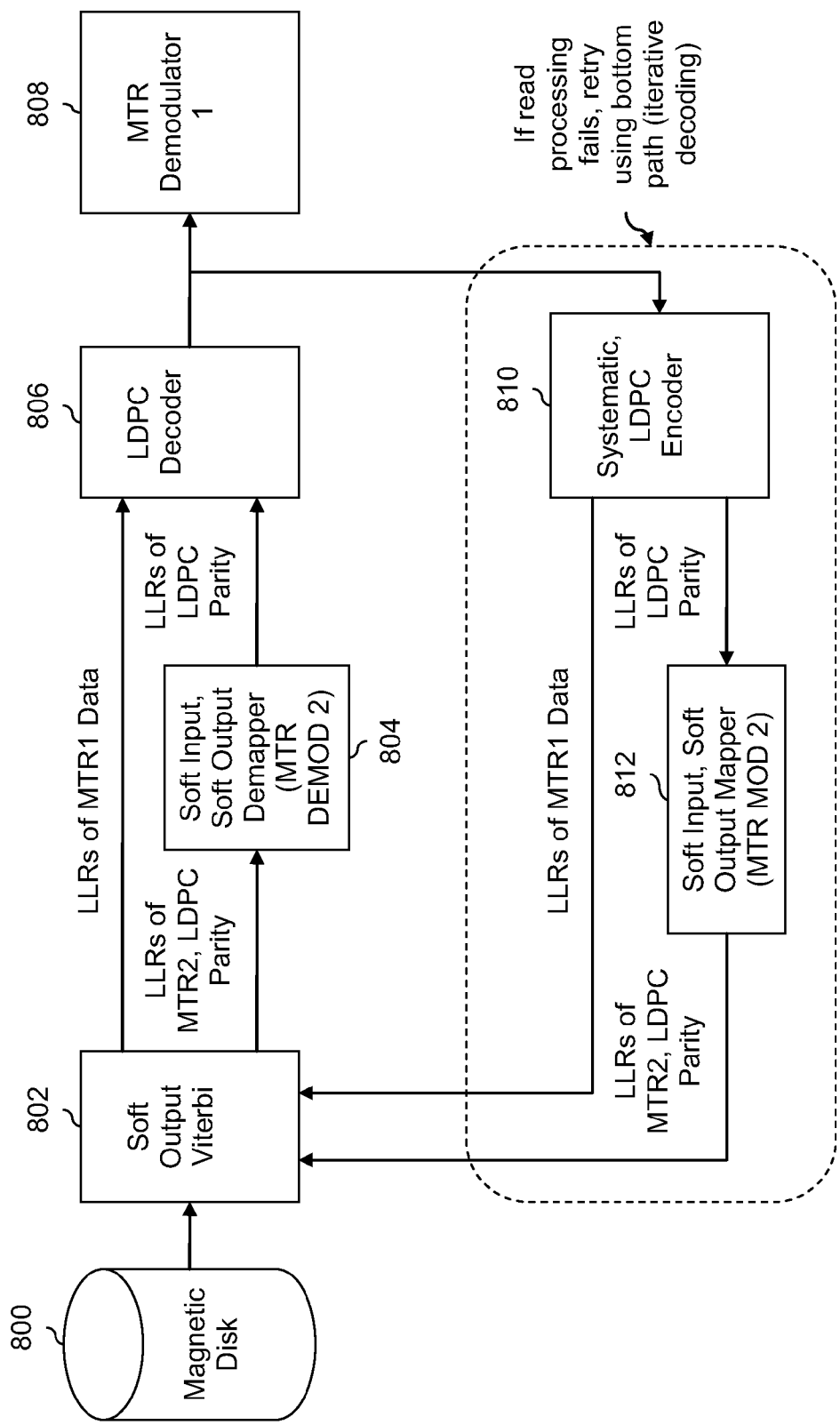
FIG. 8 is a diagram showing an embodiment of a read processor portion of a storage system.

FIG. 8 is a diagram showing an embodiment of a read processor portion of a storage system. The example read processor shown is a counterpart to the write processor shown in FIG. 7.

Information is accessed from magnetic disk 800 and is processed by soft output Viterbi 802. Soft output Viterbi 802 outputs LLRs of MTR1 data and LLRs of MTR2, LDPC parity information. The two outputs of soft output Viterbi 802 correspond to the MTR1 data and the MTR2, LDPC parity information, respectively, passed to magnetic disk 758 in FIG. 7.

Soft input, soft output demapper 804 inputs the LLRs of the MTR modulated LDPC parity information and outputs LLRs of the LDPC parity information. To use the terminology from the equations above, demapper 804 generates $LLR_{bi}$ values using $LLR_{ci}$ as an input and any of the techniques described herein may be used by demapper 804. Demapper 804 corresponds to the second MTR modulator (756) in the write processor of FIG. 7.

LDPC decoder 806 uses the LLRs of MTR1 data from soft output Viterbi 802 and the LLRs of the LDPC parity information from demapper 804 to generate a hard decision (e.g., a decision that a bit is a 0 or a 1 without any probability or certainty associated with that decision). In some embodiments an LDPC decoder can be configured to output either hard decisions or soft decisions. In some embodiments when configured to output hard decisions, hard decisions are generated by the LDPC decoder by taking the signs of the soft decisions. The hard decisions are then passed to MTR demodulator 808, which corresponds to the first MTR modulator (752) in FIG. 7. For example, the 0's and 1's inserted by the MTR modulator 752 in FIG. 7 may be removed by MTR demodulator 808.

If processing is successful, then the bottom path which includes soft input, soft output mapper 812 and systematic, LDPC encoder 810 is not used. In one example of how a system knows when read processing fails, the data output by MTR demodulator 808 may have an error correction or error detection code embedded in it. Using this code, the system is able to detect (e.g., using processors or modules downstream from MTR demodulator 808 not shown in this figure) when the capabilities of one or more codes have been exceeded and the result is incorrect.

If processing is unsuccessful and another iteration of decoding is required, then the bottom path is used. In iterative decoding, another iteration of the decoding process is performed using a different set of inputs. In this particular example, processing returns to soft output Viterbi 802 and processing is retried with inputs from LDPC encoder 810 and soft input, soft output mapper 812 in addition to information from magnetic disk 800, where the inputs from 810 and 812 are used as a priori values. To generate an additional set of inputs, the soft decision from LDPC decoder 806 is passed to systematic, LDPC encoder 810 which generates LLRs of the MTR modulated data and LLRs of LDPC parity information (in other words, LDPC encoder 810 generates soft information using soft information from decoder 806 as input). The systematic information (i.e., LLRs of MTR1 data) is passed to soft output Viterbi 802 and the LLRs of the LDPC parity information are passed to soft input, soft output mapper 812. To use the terminology from the equations above, mapper 812 generates LLR values using $LLR_{bi}$ values as input and any of the techniques described above to generate LLR (e.g., an exact value or approximation) may be used.

The LLR values from LDPC encoder 810 and mapper 812 are passed to soft output Viterbi 802 for another iteration. This technique of going through the top path and then the bottom path if needed may be repeated as many times as desired, or until read processing is successful. In some embodiments, a system is configured to stop after a certain number of iterations is reached without success.

In some embodiments, an MTR code (e.g., associated with demapper 804 and mapper 812) is selected to minimize error propagation in both the encoding and decoding directions. For example, for a set of codewords that satisfy the MTR constraint, the message-to-codeword mapping that results in the lowest error propagation effect in both directions is chosen. Error propagation occurs when an input sequence with k bit errors encodes or decodes to an output sequence with more than k bit errors, thus degrading the performance of subsequent processing blocks. If one mapping (worst case) outputs 2 errors for every 1 error input in the encoding direction and 3 errors for every 1 error input in the decoding direction whereas another mapping (worst case) outputs 1 error for every 1 error input in the encoding direction and 2 errors for every 1 error input in the decoding direction, the latter mapping is selected.

Figure 9:
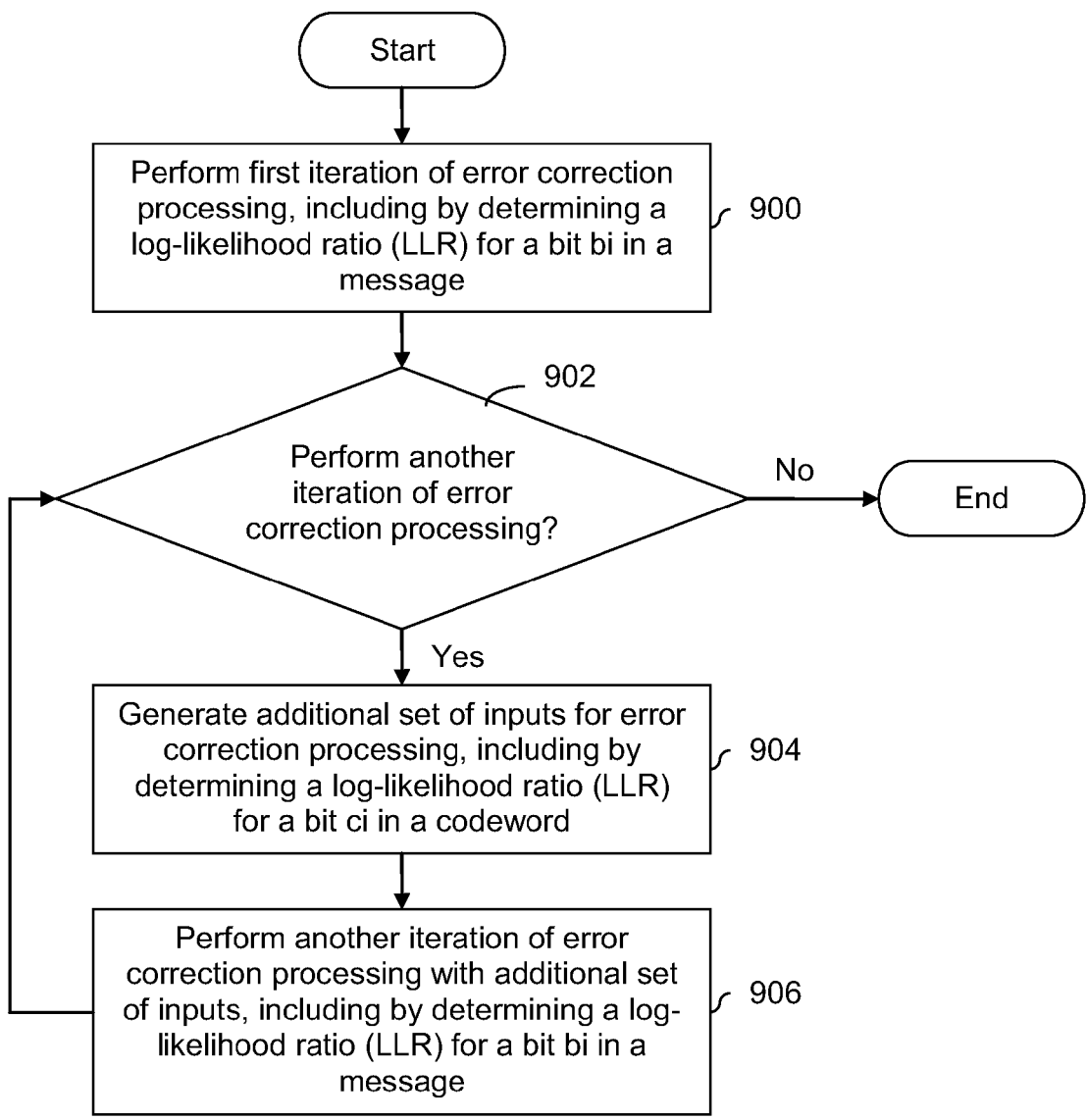
FIG. 9 is a flowchart illustrating an embodiment of a process to perform iterative decoding in the event error correction processing fails.

FIG. 9 is a flowchart illustrating an embodiment of a process to perform iterative decoding in the event error correction processing fails. In some embodiments, the read processor shown in FIG. 8 performs the example process shown.

At 900, a first iteration of error correction processing is performed, including by determining a log-likelihood ratio (LLR) for a bit bi in a message. In FIG. 8, for example, this includes using soft output Viterbi 802, demapper 804 and LDPC decoder 806. In some embodiments, the determination of an LLR for a bit bi in a message is performed by demapper 804 and includes the process shown in FIG. 2.

At 902, it is determined whether to perform another iteration of error correction processing. For example, if error correction processing is successful then there is no need to perform another iteration. Alternatively, the processor may have failed for the nth consecutive time and the system is configured to stop once a certain number of failures has been reached.

If it is determined to perform another iteration of error correction processing at 902, an additional set of inputs for error correction processing is generated, including by determining a log-likelihood ratio (LLR) for a bit ci in a codeword. In FIG. 8, for example, the additional set of inputs is generated by systematic, LDPC encoder 810 and soft input, soft output mapper 812. In some embodiments, a LLR for a bit ci in a codeword is generated by mapper 812 in FIG. 8 using the process shown in FIG. 3.

At 906, another iteration of error correction processing is performed with the additional set of inputs, including by determining a log-likelihood ratio (LLR) for a bit bi in a message. In FIG. 8 for example, soft output Viterbi is activated again using the additional inputs from LDPC encoder 810 and mapper 812 in addition to information from magnetic disk 800.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for determining a log-likelihood ratio (LLR), comprising:
   obtaining (1) a codebook which includes a plurality of messages and a plurality of codewords, (2) a specified codeword bit value, and (3) a specified message bit value; and
   using a processor to generate the LLR for bit ci in a codeword, including by:
      identifying, from the codebook, those codewords where bit ci has the specified codeword bit value;
      for a message which corresponds to one of the codewords where bit ci has the specified codeword bit value, identifying those bits which have the specified message bit value; and
      summing one or more LLR values which correspond to those bits, in the message which corresponds to one of the codewords where bit ci has the specified codeword bit value, which have the specified message bit value.

2. The method of claim 1, wherein using the processor to generate the LLR further includes:
   generating a first term, wherein:
      generating the first term includes (1) identifying, from the codebook, those codewords where bit ci has the specified codeword bit value, (2) for a message which corresponds to one of the codewords where bit ci has the specified codeword bit value, identifying those bits which have the specified message bit value, and (3) summing one or more LLR values which correspond to those bits, in the message which corresponds to one of the codewords where bit ci has the specified codeword bit value, which have the specified message bit value; and
      the specified codeword bit value equals 0; and
   generating a second term, wherein:
      generating the first term includes (1) identifying, from the codebook, those codewords where bit ci has the specified codeword bit value, (2) for a message which corresponds to one of the codewords where bit ci has the specified codeword bit value, identifying those bits which have the specified message bit value, and (3) summing one or more LLR values which correspond to those bits, in the message which corresponds to one of the codewords where bit ci has the specified codeword bit value, which have the specified message bit value; and
      the specified codeword bit value equals 1.

3. The method of claim 2, wherein the specified message bit value is the same when generating a first term and generating the second term.

4. The method of claim 2, wherein using the processor to generate the LLR further includes setting bit ci to be the first term minus the second term.

5. The method of claim 1, wherein using the processor includes using a field-programmable gate array (FPGA) or an application-specific integrated circuit (ASIC).

6. A system for determining a log-likelihood ratio (LLR), comprising:
   a processor; and
   a memory coupled with the processor, wherein the memory is configured to provide the processor with instructions which when executed cause the processor to:
      obtain (1) a codebook which includes a plurality of messages and a plurality of codewords, (2) a specified codeword bit value, and (3) a specified message bit value; and
      generate the LLR for bit ci in a codeword, including by:
         identifying, from the codebook, those codewords where bit ci has the specified codeword bit value;
         for a message which corresponds to one of the codewords where bit ci has the specified codeword bit value, identifying those bits which have the specified message bit value; and
         summing one or more LLR values which correspond to those bits, in the message which corresponds to one of the codewords where bit ci has the specified codeword bit value, which have the specified message bit value.

7. The system of claim 6, wherein the instructions for generating the LLR further include instructions for:
   generating a first term, wherein:
      generating the first term includes (1) identifying, from the codebook, those codewords where bit ci has the specified codeword bit value, (2) for a message which corresponds to one of the codewords where bit ci has the specified codeword bit value, identifying those bits which have the specified message bit value, and (3) summing one or more LLR values which correspond to those bits, in the message which corresponds to one of the codewords where bit ci has the specified codeword bit value, which have the specified message bit value; and
      the specified codeword bit value equals 0; and generating a second term, wherein:
generating the first term includes (1) identifying, from the codebook, those codewords where bit ci has the specified codeword bit value, (2) for a message which corresponds to one of the codewords where bit ci has the specified codeword bit value, identifying those bits which have the specified message bit value, and (3) summing one or more LLR values which correspond to those bits, in the message which corresponds to one of the codewords where bit ci has the specified codeword bit value, which have the specified message bit value; and
the specified codeword bit value equals 1.

8. The system of claim 7, wherein the specified message bit value is the same when generating a first term and generating the second term.

9. The system of claim 7, wherein the instructions for generating the LLR further include instructions for setting bit ci to be the first term minus the second term.

10. A computer program product for determining a log-likelihood ratio (LLR), the computer program product being embodied in a non-transitory computer readable storage medium and comprising computer instructions for:
obtaining (1) a codebook which includes a plurality of messages and a plurality of codewords, (2) a specified codeword bit value, and (3) a specified message bit value; and
generating the LLR for bit ci in a codeword, including by:
identifying, from the codebook, those codewords where bit ci has the specified codeword bit value;
for a message which corresponds to one of the codewords where bit ci has the specified codeword bit value, identifying those bits which have the specified message bit value; and
summing one or more LLR values which correspond to those bits, in the message which corresponds to one of the codewords where bit ci has the specified codeword bit value, which have the specified message bit value.

11. The computer program product of claim 10, wherein the computer instructions for generating the LLR further include computer instructions for:
generating a first term, wherein:
generating the first term includes (1) identifying, from the codebook, those codewords where bit ci has the specified codeword bit value, (2) for a message which corresponds to one of the codewords where bit ci has the specified codeword bit value, identifying those bits which have the specified message bit value, and (3) summing one or more LLR values which correspond to those bits, in the message which corresponds to one of the codewords where bit ci has the specified codeword bit value, which have the specified message bit value; and
the specified codeword bit value equals 0; and
generating a second term, wherein:
generating the first term includes (1) identifying, from the codebook, those codewords where bit ci has the specified codeword bit value, (2) for a message which corresponds to one of the codewords where bit ci has the specified codeword bit value, identifying those bits which have the specified message bit value, and (3) summing one or more LLR values which correspond to those bits, in the message which corresponds to one of the codewords where bit ci has the specified codeword bit value, which have the specified message bit value; and
the specified codeword bit value equals 1.

12. The computer program product of claim 11, wherein the specified message bit value is the same when generating a first term and generating the second term.

13. The computer program product of claim 11, wherein the computer instructions for generating the LLR further include computer instructions for setting bit ci to be the first term minus the second term.

* * * * *